Sept. 9, 1969 J. J. STERANKO 3,465,435

METHOD OF FORMING AN INTERCONNECTING MULTILAYER CIRCUITRY

Filed May 8, 1967 2 Sheets-Sheet 1

INVENTOR
JAMES J. STERANKO

BY J. Flucan Jr.

ATTORNEY

METHOD OF FORMING AN INTERCONNECTING MULTILAYER CIRCUITRY

Filed May 8, 1967 2 Sheets-Sheet 2

United States Patent Office 3,465,435
Patented Sept. 9, 1969

3,465,435

METHOD OF FORMING AN INTERCONNECTING MULTILAYER CIRCUITRY

James J. Steranko, Saratoga, Calif., assignor to International Business Machines Corporation, Armonk, N.Y., a corporation of New York Filed May 8, 1967, Ser. No. 636,859
Int. Cl. B23k *31/02;* B23p *19/02;* H05k *3/00*
U.S. Cl. 29—628 4 Claims

ABSTRACT OF THE DISCLOSURE

Manufacture of printed circuit cards with through-hole connections therein, made by raised conical risers extending from the underlayer circuitry of the card and protruding beyond the top layer circuitry, thus contacting it, and assembling a series of such cards by aligning the risers from one card with the associated conical depressions in the next card, joining by frictional contact through pressure means, or by solder reflow.

BACKGROUND OF THE INVENTION

Field of the invention

Single or multilayered laminated printed circuit cards having through-hole connectors joining opposed faces of the card, and serving as the interconnecting mating means for card-to-card assembly.

Description of the prior art

Printed circuit cards are well known in the electronics industry. In an effort to save space and to improve reliability, high-density printed circuit cards have been developed which utilize many layers of electrical circuitry stacked together and electrically interconnected. Problems have arisen in creating layer-to-layer interconnections, commonly called through-hole or via hole connections, on a single printed circuit card, and in any arrangement of many of such printed circuit cards to form a higher density stack. When strip line connectors and microcircuit modules are in turn interconnected to the printed circuit stack, the problems increase again. These problems include, difficulty in making reliable layer-to-layer or through-hole interconnections, and in arranging card upon card interconnections while retaining reliability. The prior art methods, such as drilling and electroplating to form through-hole connections, utilizing solid pins soldered between through-holes, and other such methods, have not solved this problem in a fully adequate manner.

For example, in stacking multilayer cards using conventional through-hole techniques, alignment and through-hole size becomes critical, as well as the problem of checking and plating each individual through-hole. The same is true of any solid pin insertion method, especially where such pins require heating of the multilayer stack to soldering temperatures before insertion of the pins. During such heating the stack, by thermal expansion, will move out of alignment causing individual layer interconnection problems, while an attempt is made to push the pin through the stack. Further, the more rigid an assembly is, the more susceptible that assembly will be to electrical failure from fatigue and subsequent cracking.

When contact is made by forcing a solid pin connector between two layers of circuitry on the same printed circuit card, or where contacts on one card are forced into contact with contacts on a second card, problems due to thermal expansion arise. Thus one contact may shift off another contact, a pin may shift within a card, and bonding pressure may be lost. Slippage due to normal use will also affect the electrical interconnection reliability. Further, before applying pressure to connect this multilayer stack, extensive aligning procedures must be followed to assure that every connection is fully aligned with every other connection.

In such multilayer printed circuit card assemblies, it is often desirable for engineering change or for repair purposes to have an interconnection method that allows for a quick replacement of a single layer of that multilayer stack. Most multilayer stacks which involve successive laminated planes do not allow for this. It is also desirable to connect micro-electronic circuit modules and cable connectors during assembly of the multilayer stack. The prior art methods require the use of separate soldering or thermal compression bonding methods to achieve such connections, or utilize unwieldy fixtures for cable connectors or modules.

Thus the prior art problems usually involve the steps of making a printed circuit card, drilling holes therein, electroplating or solder filling these holes, placing each card in a connector that will connect it to a second card, or stacking one card upon another by the use of pins through these solder-filled holes, separately attaching cable connectors, and separately attaching microcircuit modules.

The problems associated in the multi-step manufacture of such cards, and those problems of interconnection as outlined above, are overcome economically by the present invention.

SUMMARY OF THE INVENTION

This invention pertains to a method of manufacture including the steps of using a forming sheet having raised conical riser portions thereon, depositing an electrically conductive material layer over said sheet on the side having the raised conical portions, placing a pre-punched sheet of dielectric material over the forming sheet and in contact with the electrically conductive material, and adding a sheet of an electrically conductive foil layer, with specially formed truncated flared holes therein, over, and upon and in alignment with the raised conical portions on the forming sheet. This assembly is then laminated by means of heat and pressure. The forming sheet is then removed, leaving a two-sided printed circuit card having through-hole connections therein formed by contact of the raised conical portions from the underlayer contacting the internal walls of the truncated flares on the foil layer, and extending above the plane of the foil layer. Layer-to-layer insulation is obtained through the dielectric sheet. Electrical circuitry may then be formed on either or both sides of the printed circuit card. Next, a coating of a protective dielectric material is placed on that side of the card having the raised conical risers, so as to cover the sheet but not the tips or sides of the raised conical risers. These conical risers are then coated with an electrically conductive material, such as a precious metal, further connecting the underlayer protrusion and the top layer foil. Layer-to-layer interconnection now having been made, stacks of these printed circuit cards may be assembled to form multilevel multilayer circuitry.

An object of this invention is to provide an improved and economical method of manufacturing multilayer printed circuit card assemblies.

A further object of this invention is to form through-hole interconnections during the manufacture of the printed circuit cards.

Still another object is to simultaneously create raised conical connectors and associated conical depressions on said printed circuit cards during their manufauture, the conical members acting not only as through-hole connectors but also allowing a set of printed circuit cards to be stacked upon each other, causing interconnections to be made by frictional contacts from card to card.

It is another object of this invention to allow microcircuit modules having conical depressions therein to be placed directly upon and electrically connected to such printed circuit cards.

A further object is to allow circuit planes, strip-line connectors, and microcircuit modules to be assembled interconnected at one time.

These and other objects of the invention will be understood more fully by the following description when read in conjunction with the accompanying drawings.

BRIEF DESCRIPTION OF THE DRAWINGS

FIG. 2*b* is an exploded view of an assembly pertaining to steps 26–28 of FIG. 2*a*;

DETAILED DESCRIPTION

Printed circuit card

Figure 2A:
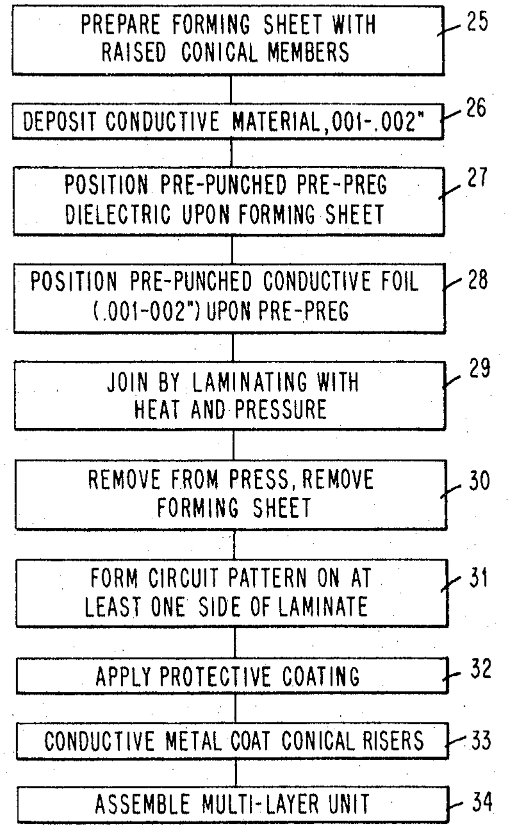
FIG. 2*a* is a flow chart illustrating the steps in the method of manufacture of the printed circuit card in this invention.

The manufacture of the printed circuit cards to be used in this assembly is outlined in FIG. 2*a*. First, during step 25 thereof, a flat forming sheet 70 (see also FIG. 2*b*) is prepared with truncated raised conical members 71 thereon. Each member may extend approximately .020 inch above the plane of sheet 70 which, for example, may be of stainless steel. The conical members may be spaced on centers .050 inch apart, with a base approximately .030 inch in diameter tapering to .010–.015 inch in diameter at the peak. When using a forming sheet 10 by 15 inches in sizes, for example, appropriate room (e.g., 1½ inches along each side) should be left as a border and for alignment purposes.

After the forming sheet step 25 (FIG. 2*a*) has been completed and during step 26, an electrically conductive material 72 (FIG. 2*b*) such as copper is deposited upon sheet 70 to a thickness of .001–.002 inch. This may be done, for example, by electroplating copper upon the stainless steel sheet. Next, a sheet of pre-punched prepreg dielectric material layer 73 is positioned upon the plated forming sheet during step 27 (FIG. 2*a*) such that the holes in dielectric layer 73 (FIG. 2*b*) surround the raised conical members 71. This sheet may be .005–.010 inch thick, and, depending upon the temperature at which the assembly will be utilized, may be of a conventional epoxy glass, silicone glass, or other suitable laminating dielectric material. Then, a sheet of pre-punched electrically conductive foil layer 74, such as copper, is positioned upon the dielectric material layer 73 during step 28 (FIG. 2*a*). In punching the copper foil layer 74, it is desirable to punch completely through the sheet, and in such a fashion that raised truncated flare members 76 (FIG. 2*b*) protrude opposite the side where the punch has entered the sheet. Thus, when conductive foil layer 74 is positioned upon dielectric material layer 73 which, in turn, has been positioned upon the forming sheet 70, the interior surfaces of truncated flare members 76 will contact the raised conical members 71 on conductive layer 72.

At this point, an electrically conducting foil layer 74 is resting upon a prepreg pre-punched dielectric layer 73, which is resting upon the electrically conducting deposited layer 72 on the forming sheet 70. The raised conical members of the deposited layer 72 protrude through the dielectric layer 73 and through the foil layer 74, and thus electrically contact the foil layer 74. Next, during step 29 (FIG. 2*a*), the layers 72, 73, 74 (FIG. 2*b*) are laminated with heat and pressure.

During step 30 (FIG. 2*a*) the assembly is removed from the laminating press and the forming sheet removed, leaving a printed circuit card. This card, including layers of conductive material separated by a dielectric material layer, has integral through-hole connections therein. This is shown in FIG. 2*b* as deposited layer 72 via raised conical member 71 contracts truncated flare member 76 on the foil layer 74 where the raised conical member 71 protrudes through the foil layer 74. This electrical contact is mechanical in nature. The combination of a raised conical member and a truncated flare member now form, on the resulting printed circuit card, a raised conical riser.

Figure 5:
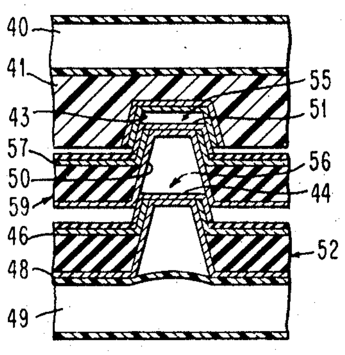
FIG. 5 shows an additional configuration of riser-depression combinations.
Figure 5:
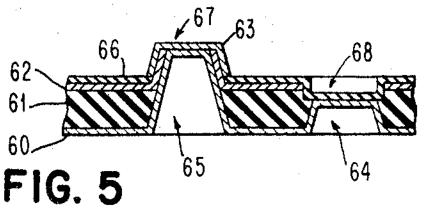

It is clear that wherever a truncated raised conical member 71 was present on the forming sheet 70, removal of the sheet will result in a truncated conical depression associated with each raised conical riser in the resulting printed circuit card. Each raised conical riser with its associated conical depression forms a riser-depression pair, which is the basis of card-to-card assembily, discussed later. Such a riser depression pair 67–65 is shown in FIG. 5.

While stainless steel was used for the forming sheet in this example, any material will suffice that (a) will accept a deposit of an electrically conductive material, and (b) allow that material to be transferred to the dielectric material layer during lamination by reason of being more adherent to the dielectric material layer than to the forming sheet material. The forming sheet material used, of course, must have the necessary temperature properties to be compatible with the laminating process.

Circuit patterns are placed on at least one side of the printed circuit card during step 31 (FIG. 2*a*). This is most easily done by conventional photoresist and photoetching methods. Then, during step 32, a protective coating of a dielectric material is placed over that face of the printed circuit card having the raised conical risers so as to form a dielectric layer .001–.002 inch thick, and specifically not covering the tips or sides of the risers. This material may be, for example, a polyimide, applied by pouring.

During step 33 an electrically conductive material is coated over the raised conical risers, such that additional electrical contact is made between the conductive foil layer 76 (FIG. 2*b*) and the conductive deposited layer 72. This electrically conductive material may be, for example, a precious metal, such as gold, which also serves to protect the raised conical risers from oxidation.

At this pooint a printed circuit card having circuitry etched upon at least one face of the card and having through-hole connections made therein, having a protective dielectric coating on one face, and with a precious metal coating over the raised conical risers, is ready for assembly and interconnection during step 34 (FIG. 2*a*) with similar printed circuit cards.

Any of the conventional deposition methods may be used for creating the deposited layer upon the forming sheet. These methods include vapor deposition, sputtering, electroless plating, electroplating, spraying, or other methods. While copper is the preferred material, it is apparent that any electrically conductive material may be utilized. Further, it is not necessary that the foil layer 74 (FIG. 2*b*) and the deposited layer 72 be of the same electrically conductive material. However, the desired material is copper.

Should it be desired during later assembly to perform soldering operations, the raised conical risers may be coated with a solder-contact material in place of a precious metal. For the purposes of this invention, a solder-contact material is defined as any low-melting point material, such as conventional tin-lead solder, tin-lead-indium solders, or, in other words, materials generally associated as solder materials by temperature limitations, as opposed to brazing materials. Also for the purposes of this invention, a solderable material is defined as any material capable of being wetted by solder, particularly that solder on the conical risers at that time.

Figure 3:
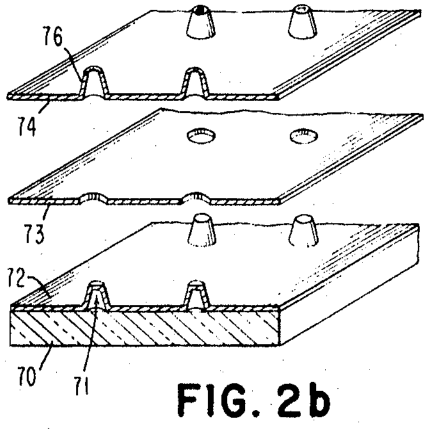
FIG. 3 is a cross-sectional view of a multi-level assembly before stacking.

A cross-section of the printed circuit card formed by the process illustrated in FIG. 2*a*, taken through a conical riser portion, is identified by numeral 52 in FIG. 3. The printed circuit card may include, for example, a deposited layer of copper 48, a layer of dielectric insulating material 47, a top foil layer of copper 46, a protective dielectric layer 45, and a riser coating 44 of precious metal. It will be noted that the diameter of the riser tip, including coating 44, is less than the diameter of the base of the associated riser depression 53, and that the riser itself extends for some distance above the nearest dielectric layer 45.

Alternatively, it may be desired to form such a printed circuit card having raised conical risers and associated conical depressions wherein less than all positions have risers, but all positions have depressions. Such a card is illustrated in FIG. 5. Riser-depression combination identified by numerals 67–65 extends beyond protective dielectric layer 66 of the card, as before. "Riser"-depression 68–64 is designed so as not to protrude beyond the level of foil layer 66, but to be a depression to allow later contact with a riser from another card. To form this depression without forming a riser, some of the raised conical members on the forming sheet would be of lesser heights than others, such that the smaller raised conical members would not protrude beyond dielectric layer 61. Similarly, any matching hole punched in foil layer 62 would be made without a truncated flare member. Thus on lamination, only a depression 64 would be formed at those areas, while riser-depression combinations 67–65 would be formed elsewhere. Further steps 31–33 (FIG. 2*a*) are as before such that, in FIG. 5, successive layers consist of copper 60, dielectric 61, copper 62, dielectric 66, and precious metal 63.

In another variation, after deposition of an electrically conductive material 72 (FIG. 2*b*) upon the forming sheet 70, solder-conttact material may be deposited upon the top and sides of the raised conical members. A dielectric material layer 73 and the foil layer 74 are next positioned upon each other as in steps 27–28 (FIG. 2*a*). Upon laminating during step 29 at a temperature sufficient to melt the solder-contact material, it will wet the top foil layer, resulting in an internally soldered electrically conductive connection. This raised conical riser is then both a metallurgical contact by solder as well as a mechanical contact. Succeeding steps 30–33 are as before stated This manufacturing method is also useful in making strip-line connectors. A strip-line connector is generally defined as a set of conductive paths and end contact points upon a dielectric material, used to interconnect one electronic assembly to another. It may be flexible or inflexible as desired. When used in conjunction with a stacked printed circuit card assembly, the strip-line connector is generally used as the transfer medium for bringing power from and returning signals to an outside source. To make a strip-line connector by the method of my invention, it is only necessary to use a forming sheet having termination points in the form of raised conical members at one end of the sheet. Deposition of an electrically conductive layer is done upon the forming sheet, a pre-punched prepreg dielectric layer is positioned over the forming sheet, and an electrically conductive foil layer with pre-punched truncated flare members is positioned upon it, as done in steps 25–28 (FIG. 2*a*). After lamination 29, strip-lines are etched upon at least one side of the printed circuit strip-line connector. Alternatively, the strip-line pattern may be etched on the forming sheet prior to placing the dielectric layer thereon. The size of the sheet is designed such that upon later assembly, contact will be made within the printed circuit card stack, and portions of the strip-line connector sheet will extend beyond said stack for external contact.

It should further be noted that while for economic reasons, precious metal coating has been limited to the raised conical risers, coating of an electrically conductive material, such as the precious metal described, may also be done on the internal walls of the conical depressions. Such coating 43 (FIG. 3) is illustrated within the conical depression 55 shown within circuit module 41. Circuit module 41 is designed such that internal contacts from, for example, intergrated circuit devices, lead to contacts 42–43 within conical depression 55. These conical depressions may later be used to contact the circuit module to the printed circuit card. The depression 55 in circuit module 41 consists of a first layer of electrically conductive material 42, such as copper, and a second coating of electrically conductive material 43, such as a precious metal.

Multi-level stacking

Figure 1:
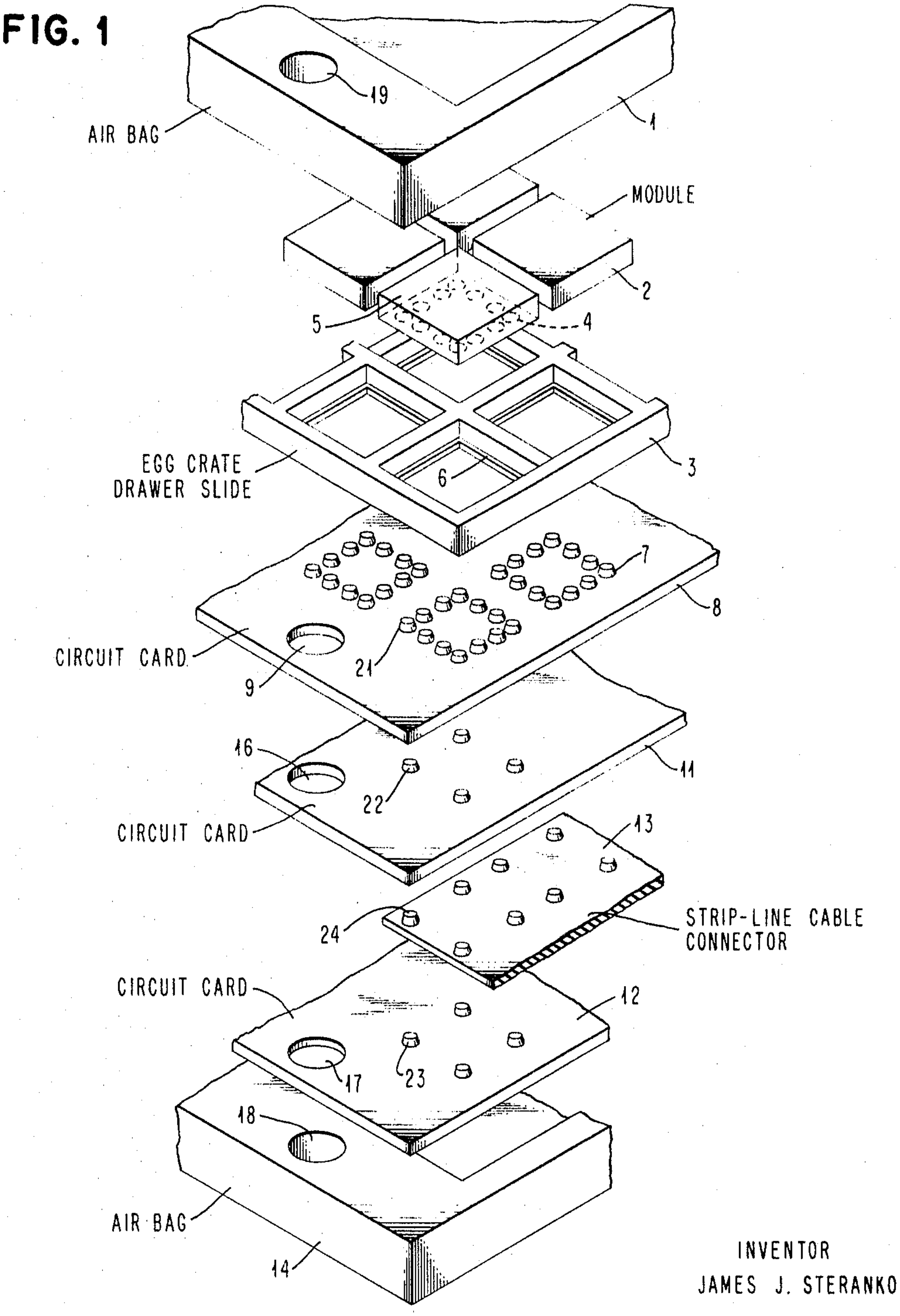
FIG. 1 is an exploded view of an assembly showing three circuit cards, a cable connector, micro modules, and air bag pressure applicators.

A series of printed circuit cards made by the method of this invention may be stacked into a multi-level printed circuit card assembly or stack, including cable connectors and microcircuit modules. FIG. 1 shows an exploded view of such a multi-level assembly. This assembly consists of a strip-line connector 13, circuit cards 8, 11, 12, microcircuit modules 2, and a microcircuit module drawer-slide 3. For clarity of illustration, raised conical risers on cards 8, 11, and 12 are limited to a few select positions, though it is clear that a greater number may be produced.

Aligning egg crate drawer-slide 3 is placed upon circuit card 8. Microcircuit module 5 having conical depression 4 is placed in slide 3 which has a slight protruding lip 6, to prevent the module from falling through. Module 5 is placed within the slide so as to bring conical depression 4 into alignment with raised conical riser 21. Similarly, riser 23 on sheet 12 and riser 24 on cable strip-line connector 13 are brought into alignment. Alignment is achieved through use of aligning holes 9, 16, and 17, on the circuit planes and alignment holes (not shown) on cable connector 13. The assembly is further aligned with air bag pressure applicators 14 and 1 by use of alignment holes 18 and 19. This assembly, then, consists of circuit cards, strip-line cable connector, microcircuit modules, drawer-slide aligner for the microcircuit modules, and air bag pressure applicators. It is apparent that, for example, riser 22 on sheet 11 will mate with the conical depression associated with riser 21 on sheet 8. This is illustrated in FIG. 3, which shows two circuit cards 52 and 59, a microcircuit module 41, and two air bag pressure applicators 40, 49, prior to assembly. Alignment is maintained such that conical depression 55, conical riser tip 51, conical depression 56, and conical riser tip 44, are all in alignment.

Figure 4:
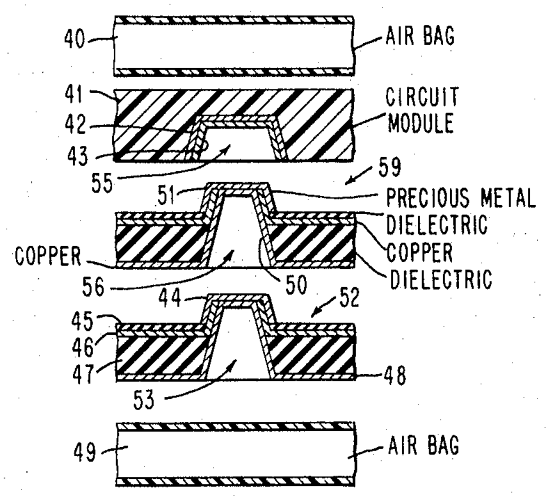
FIG. 4 shows the assembly in FIG. 3 after stacking pressure has been applied.

When the circuit cards 52, 59 and module 41 are contacted and pressure applied through the use of the air bag pressure applicators 40, 49, the assembly appears as illustrated in FIG. 4. Conical riser tip 44 on card 52 makes frictional contact with the internal ellectrically conductive material 50 of conical depression 56 on card 59, while conical riser tip 51 on card 59 similarly makes contact with the electrically conductive material 43 within conical depression 55 on module 41. Due to the difference in diameter between the top of the tip on the riser and the base of the conical depression, alignment tolerances are not critical. Further, when utilizing a precious metal, such as gold, for the riser tips 51 and 44, a deformation occurs when pressure is applied, for example, between riser tip 44 and wall 50 of depression 56, thus increasing the reliability of electrical contact. Considering the great number of such riser-depression contacts on a card, for example, 10 by 15 inches in size, with risers on .050 inch centers, and each riser interconnected into a depression, slippage is not possible. Thus in the illustration shown, microcircuit module 41 is connected to electrically conducting layers 57, 50, 46, and 48. It is clear to those skilled in the art that additional circuit cards and cable connectors may be added to this assembly, as desired.

When it is desired that, for example, microcircuit module 41 is to contact circuit lines on circuit card 52, but should not contact circuit lines on any other circuit card, this is done by isolating riser-depression combinations such as 50–51 during the circuit pattern etching process. Thus electrical contact from the module 41 to circuit plane 52 is made while circuit lines on either conducting layer of circuit plane 59 do not contact the riser-depression combination 51–50, allowing it to serve only as a through-hole connection path.

Further, if a solder-contact material is deposited upon the risers and the assembly contacted as shown in FIG. 4, the heating of this assembly to a temperature sufficient to melt the solder and allow it to wet the inside of the conical depressions will result in a rigid solder-contacted assembly.

Where a circuit card such as that shown in FIG. 5 is utilized, it is apparent that a through-hole contact will be made from a riser-depression combination 67–65, whereas a riser tip from a preceding sheet entering conical depression 64 will have contact terminated at depression 64. Circuit cards such as that illustrated in FIG. 5 may be combined with circuit cards having all riser-depression combinations. Further, while two air bag pressure applicators are described, one skilled in the art will note that a single pressure applicator could be used, and that the medium is not limited to expansible air bag type applicators. However, the use of expansible bag type applicators. However, the use of expansible bag type applicators allows rapid cooling of such an assembly while in operation, by circulation of a cooling fluid through said bags.

The advantages of this manufacturing and assembly method are clear to those skilled in the art. Slippage card-to-card is eliminated, while assuring good frictional contact between cards. Further, through-hole continuity is achieved within individual cards during the laminating method, without the necessity of additional through-hole plating operations, solder-filling operations, drilling operations, or other required steps. To interchange a circuit card for one currently in a stack, it is necessary only to release the pressure holding the stack together, remove the card involved, and substitute a new card. Where solder contacts are made, of course, the assembly must be reheated and the card removed. However, where pressure contact alone is utilized, such circuit card interchange is readily achieved. Further, a failure in a microcircuit module is easily corrected by merely releasing the pressure, removing the defective module, and replacing it with another module. Circuit card to circuit card alignment is not critical due to the differing diameters between the riser tips and the base of the conical depressions. Depending upon the thickness of the dielectric insulator layer used in the manufacture of the circuit card, and the nature of such material, circuit cards and strip-line connectors may be made as flexible or inflexible cards.

Thus circuit cards, cable connectors, and microcircuit modules, each having conical risers and depressions therein as made by the method of this invention, may be assembled into a multi-level electronic assembly of high density and high reliability.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of making a laminated printed circuit card having through-hole connections comprising the steps of:
   depositing an electrically conductive layer upon a forming sheet having raised conical members thereon;
   positioning a layer of pre-punched dielectric laminating material upon said deposited conductive layer so that pre-punched holes in said dielectric material are aligned with corresponding raised conical members of said forming sheet and said members extend through said holes;
   positioning a pre-punched electrically conductive foil layer upon said dielectric layer so that truncated flare members about holes in said foil layer are aligned for reception on the internal surfaces of the flares with the corresponding raised conical members outer surfaces;
   joining said deposited, dielectric and foil layers by laminating with heat and pressure to force said raised conical members into electrical and mechanical contact with the corresponding truncated flare members internal surfaces, so as to effect corresponding raised conical risers;
   removing said forming sheet from the said deposited electrically conductive layer so as to leave a multilayer printed circuit card having a plurality of raised conical risers on one side of said card and associated conical depressions on the other side of said card through-hole connected therein.

2. The method of claim 1 additionally comprising the step of:
   depositing a solder-contact material upon said raised conical members so that during said joining step the solder-contact material is melted to cause internal wetting of truncated flare members for further electrically connecting said deposited layer to said foil layer.

3. The method of claim 1 including the additional step of photoetching circuit patterns on at least one electrically conductive layer.

4. The method of claim 1 including the additional step of:
   coating said foil layer with a protective dielectric layer so as to leave the tips and sides of said conical risers uncoated, and
   depositing an electrically conducting material over the tips and sides of said conical risers, said electrically conducting material thus physically contacting both the foil layer and the deposited layer that jointly form the raised conical riser so as to effect additional through-hole connection.

References Cited

UNITED STATES PATENTS

| | | | |
|---|---|---|---|
| 2,100,333 | 11/1937 | Hess. | |
| 2,502,291 | 3/1950 | Taylor | 29—626 XR |
| 3,013,188 | 12/1961 | Kohler | 29—625 XR |
| 3,024,151 | 3/1962 | Robinson. | |
| 3,060,076 | 10/1962 | Robinson. | |
| 3,153,750 | 10/1964 | Ackerman. | |
| 3,193,789 | 7/1965 | Brown | 174—68.5 XR |
| 3,268,774 | 8/1966 | Ortner. | |
| 3,312,879 | 4/1967 | Godijahn | 65—59 |
| 2,832,427 | 4/1958 | Shotwell | 339—17 |

JOHN F. CAMPBELL, Primary Examiner

ROBERT W. CHURCH, Assistant Examiner

U.S. Cl. X.R.

29—423, 469, 471.1, 472.5, 482, 502, 624, 625, 626, 629; 117—212; 156—3; 174—68.5; 317—101; 339—17